(12) United States Patent
Pola

(10) Patent No.: US 10,312,179 B2
(45) Date of Patent: Jun. 4, 2019

(54) CIRCUIT ARRANGEMENT, AND CURRENT TRANSFORMER

(71) Applicant: Conti Temic microelectronic GmbH, Nuremberg (DE)

(72) Inventor: Olivier Pola, Lavernose (FR)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 8 days.

(21) Appl. No.: 15/307,897

(22) PCT Filed: Apr. 23, 2015

(86) PCT No.: PCT/EP2015/058819
§ 371 (c)(1),
(2) Date: Oct. 31, 2016

(87) PCT Pub. No.: WO2015/165800
PCT Pub. Date: Nov. 5, 2015

(65) Prior Publication Data
US 2017/0062307 A1    Mar. 2, 2017

(30) Foreign Application Priority Data

Apr. 30, 2014 (DE) .................. 10 2014 208 255

(51) Int. Cl.
*H01L 23/473* (2006.01)
*H01L 23/467* (2006.01)
(Continued)

(52) U.S. Cl.
CPC ............ *H01L 23/473* (2013.01); *H01L 23/04* (2013.01); *H01L 23/467* (2013.01);
(Continued)

(58) Field of Classification Search
None
See application file for complete search history.

(56) References Cited

U.S. PATENT DOCUMENTS

2007/0290311 A1* 12/2007 Hauenstein ......... H01L 23/3735
257/685
2011/0053741 A1*  3/2011 Heuser ................. H01T 19/00
492/53
(Continued)

FOREIGN PATENT DOCUMENTS

DE   102004011808 A1   9/2005   ............. H01L 21/58
EP   2685494 A1        1/2014   ........... H01L 23/473
(Continued)

OTHER PUBLICATIONS

German Office Action, Application No. 102014208255.2, 5 pages, dated Jan. 22, 2015.
(Continued)

*Primary Examiner* — Charles D Garber
*Assistant Examiner* — Xiaoming Liu
(74) *Attorney, Agent, or Firm* — Slayden Grubert Beard PLLC

(57) ABSTRACT

The teachings of the present disclosure relate to electrical circuits and embodiments may include a circuit arrangement and a current converter comprising said circuit arrangement. An example circuit arrangement may include: a carrier part; a power component; a cooling channel for conveying a cooling agent; and a busbar conducting a current to the power component. The busbar may be arranged on the carrier part and have a region with a first surface and a second surface arranged opposite the first surface. The region may project away from the carrier part into the cooling channel. The power component may be arranged on (Continued)

the first surface of the region and connected to the region in an electrically conductive and mechanical manner.

9 Claims, 1 Drawing Sheet

(51) Int. Cl.
*H01L 23/495* (2006.01)
*H01L 23/498* (2006.01)
*H01L 25/18* (2006.01)
*H01L 23/04* (2006.01)
*H01L 25/07* (2006.01)

(52) U.S. Cl.
CPC .. *H01L 23/49562* (2013.01); *H01L 23/49575* (2013.01); *H01L 23/49844* (2013.01); *H01L 23/49861* (2013.01); *H01L 25/18* (2013.01); *H01L 25/07* (2013.01); *H01L 2224/291* (2013.01); *H01L 2224/32245* (2013.01)

(56) References Cited

U.S. PATENT DOCUMENTS

| | | | |
|---|---|---|---|
| 2011/0183198 A1* | 7/2011 | Byun | H01M 2/0456 429/185 |
| 2013/0087307 A1 | 4/2013 | Brandenburg et al. | 165/51 |

FOREIGN PATENT DOCUMENTS

| | | | | |
|---|---|---|---|---|
| JP | 2004363337 A | 12/2004 | | H01L 23/34 |
| JP | 200505721 A | 3/2005 | | H01L 23/473 |
| JP | 2005057130 A | 3/2005 | | H01L 23/473 |
| JP | 2006339239 A | 12/2006 | | H01L 23/44 |
| JP | 2009283766 A | 12/2009 | | H01L 23/473 |
| WO | 2015/165800 A1 | 11/2015 | | H01L 23/31 |

OTHER PUBLICATIONS

International Search Report and Written Opinion, Application No. PCT/EP2015/058819, 23 pages, dated Jul. 28, 2015.

* cited by examiner

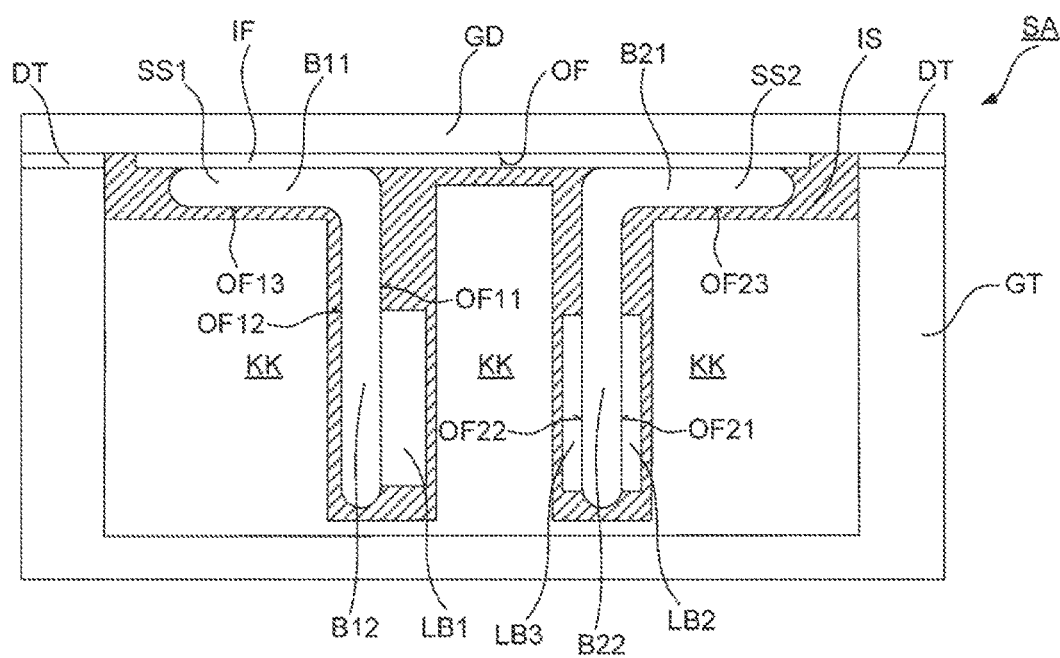

CIRCUIT ARRANGEMENT, AND CURRENT TRANSFORMER

CROSS-REFERENCE TO RELATED APPLICATIONS

This application is a U.S. National Stage Application of International Application No. PCT/EP2015/058819 filed Apr. 23, 2015, which designates the United States of America, and claims priority to DE Application No. 10 2014 208 255.2 filed Apr. 30, 2014, the contents of which are hereby incorporated by reference in their entirety.

TECHNICAL FIELD

The teachings of the present disclosure relate to electrical circuits and embodiments may include a circuit arrangement and a current converter comprising said circuit arrangement.

BACKGROUND

Circuit arrangements with power components, specifically power electronic components for the supply of phase currents to an electric motor, are associated with high power losses which occur during the operation of circuit arrangements. Power losses in the form of waste heat result in a temperature increase and deteriorations in the performance of power components or circuit arrangements including, in extreme cases, the failure of power components or circuit arrangements. Waste heat therefore needs to be evacuated from power components or circuit arrangements promptly upon the generation thereof.

SUMMARY

The teachings of the present disclosure may provide a cost-effective option for the efficient evacuation of waste heat from power components or circuit arrangements.

Some embodiments may include a circuit arrangement (SA), comprising: a carrier part (GD), a power component (LB1, LB2, LB3), a cooling channel (KK) for conveying a cooling agent, and a busbar (SS1, SS2) for conducting a current to the power component (LB1, LB2, LB3), which is arranged on the carrier part (GD) and has a region (B12, B22), which, with a first surface (OF11, OF21) and a second surface (OF12, OF22), arranged opposite the first surface (OF11, OF12), projects away from the carrier part (GD) into the cooling channel (KK). The power component (LB1, LB2, LB3) is arranged on the first surface (OF11, OF21) of the region (B12, B22) and is connected to the region (B12, B22) in an electrically conductive and mechanical manner.

In some embodiments, the region (B12, B22) projects away from the carrier part (GD) at an angle, specifically perpendicularly, to the surface (OF) of the carrier part (GD).

In some embodiments, the busbar (SS1, SS2), the power component (LB1, LB2, LB3) and/or the surface (OF) of the carrier part (GD) are insulated from the cooling channel (KK) by an electrically insulating and thermally conductive insulating layer (IS).

In some embodiments, the insulating layer (IS) is provided with a film thickness exceeding 50 micrometers, specifically exceeding 100 micrometers, and more specifically up to 300 micrometers.

In some embodiments, the insulating layer (IS) contains a thermoset plastic, a thermoplastic, specifically a cast plastic, and/or lacquer.

Some embodiments may include a current converter incorporating a circuit arrangement (SA) as described above.

BRIEF DESCRIPTION OF THE DRAWINGS

An exemplary embodiment of the invention is described in greater detail hereinafter, with reference to FIG. 1.

FIG. 1 shows a schematic cross-sectional representation of a circuit arrangement SA of a current converter.

DETAILED DESCRIPTION

Some embodiments include a circuit arrangement. The circuit arrangement comprises a carrier part, at least one power component and a cooling channel for conveying a cooling agent. The circuit arrangement may comprise at least one busbar for conducting a current to the power component.

To this end, the busbar is arranged on the carrier part, and forms a part of the strip conductors. The busbar has a region, which, with a first surface and with a second surface, arranged opposite the first surface, projects away from the carrier part into the cooling channel. The power component is arranged on the first surface of the region such that it may receive the flux of cooling agent flowing through the cooling channel, and is connected to the region in an electrically conductive and mechanical manner.

The carrier part may be part of the housing of the circuit arrangement, specifically as a housing cover of the housing. In such embodiments, a circuit carrier, which would otherwise be required as a carrier for the busbars and the power components, can be omitted.

Alternatively, however, the carrier part can be configured as a circuit carrier, specifically as a ceramic substrate.

The various embodiments take advantage of the teachings of the present disclosure including principle that the shorter the thermal conduction path from the heat source, namely the power components, to the heat sink, e.g. the cooling agent, the more efficient the cooling of the circuit arrangement will be.

To reduce this thermal conduction path to a technically feasible minimum, it is recognized, in the context of the disclosure, that the shortest path would be the direct immersion of power components in the cooling agent. In the alternative, the teachings of the present disclosure may be employed to maintain the mechanical connection between the power components and the carrier part, and electrical connections of the carrier part to the power components.

Some embodiments include a busbar, one region of which is connected to the carrier part in a mechanically and electrically conductive manner, and a further region of which projects away from the carrier part into the cooling channel. A first surface of the region and a second surface, arranged opposite the first surface, project into the cooling channel such that both inward-facing surfaces can receive the flux of cooling agent flowing in the cooling channel.

The power component is arranged on the first surface and is connected to the region in a mechanically and electrically conductive manner. As the first surface projects into the cooling channel, the power component can also receive the flux directly by the cooling agent flowing in the cooling channel. Accordingly, waste heat generated in the power component is discharged directly from the power component to the cooling agent, with no indirect routing. This solution can achieve virtually the same effect as the direct immersion of the power component in the cooling agent.

As the busbar is thus employed as a part of the strip conductors for power components, the above-mentioned solution can be executed cost-effectively, with no additional components. A cost-effective option is thus provided for the efficient evacuation of waste heat from power components or circuit arrangements.

In some embodiments, the region of the busbar projects away from the carrier part at an angle to the surface of the carrier part. Specifically, the region projects away from the carrier part perpendicularly to the surface of the carrier part. An angle of inclination of the region to the surface of the carrier part can thus be set at will, according to the design of the circuit arrangement or carrier element. It is only important that, in this region, the power element is at least substantially or entirely arranged to receive the flux of cooling agent.

In some embodiments, the busbar, the power component, and/or the surface of the carrier part which faces the cooling channel and is arranged on the busbar are electrically insulated from the cooling channel by an electrically insulating and thermally conductive insulating layer. The insulating layer may prevent electrical short-circuits in the power components and in the circuit on the carrier part associated with the cooling agent.

In some embodiments, the insulating layer may have a film thickness exceeding 50 micrometers, exceeding 100 micrometers, and/or up to 300 micrometers. The insulating layer may comprise a thermoset plastic, a thermoplastic, a cast plastic, and/or a lacquer. Thermoset plastics, thermoplastics, and lacquers in various forms can be obtained cost-effectively as mass-produced products.

In some embodiments, a current converter, specifically a converter or an inverter, incorporates a circuit arrangement of the above-mentioned type.

Advantageous configurations of the above-mentioned circuit arrangement, insofar as they are also transferable to the above-mentioned current converter, are also to be considered as advantageous configurations of the current converter.

As shown in FIG. 1, the circuit arrangement may comprise a housing part GT, configured as a wall-type structure and enclosing a void. The void forms a cooling channel KK for conveying a cooling agent.

The circuit arrangement SA may also comprise a housing cover GD arranged on the housing part GT and closing the void on one side. Both the housing part GT and the housing cover GD may primarily comprise an aluminum alloy and/or a copper alloy. Between the housing part GT and the housing cover GD, a sealing joint DT is arranged in the form, for example, of a shaped sealing ring, which provides a fluid-tight seal of both the void and the cooling channel KK.

On a surface OF facing the cooling channel KK, the housing cover GD may include a first and a second busbar SS1, SS2. The busbars SS1, SS2 may be secured to the housing cover GD by means of an electrically-insulating adhesive insulating foil IF, and simultaneously electrically insulated from the housing cover GD. These busbars SS1, SS2 are electrically connected, either directly or by means of electrical connections which are not represented in the FIGURE, to circuit components which are likewise not represented in the FIGURE, and are located outside the void. The function of the two busbars SS1, SS2 is the transmission of electric current.

The first busbar SS1 comprises a first region B11 and a second region B12, wherein the two regions B11, B12 are bent in a L-shape, in relation to each other. In the first region B11, the first busbar SS1 may be mechanically bonded to the adhesive insulating foil IF or housing cover GD.

The second region B12 projects away from the housing cover GD, perpendicularly to the surface OF of the housing cover GD, and thus into the cooling channel KK. The second region B12 has a first surface OF11 and a second surface OF12, arranged opposite the first surface OF11. A power component LB1 is arranged on the first surface OF11, which is connected to the first busbar SS1 in a mechanically and electrically conductive manner, by means of a soldered joint which is not represented in the FIGURE.

With the circuit arrangement SA in service, the busbar SS1 conducts a current to the power component LB1, which is conducted away from the power component LB1 by a further busbar which is not represented in the FIGURE. The power component LB1 is configured, for example, as a power capacitor.

Correspondingly, the second busbar SS2 comprises a first region B21 and a second region B22, wherein the two regions B21, B22 are also bent in a L-shape in relation to each other. By means of the first region B21, the second busbar SS2 may be mechanically bonded to the adhesive insulating foil IF or to the housing cover GD.

The second region B22 projects away from the housing cover GD, perpendicularly to the surface OF of the housing cover GD, and thus also into the cooling channel KK. The second region B22 has a first surface OF21 and a second surface OF22, arranged opposite the first surface OF21. A further power component LB2 is arranged on the first surface OF21 of the second region B12, which is connected to the second busbar SS2 in a mechanically and electrically conductive manner, by means of a soldered joint which is not represented in the FIGURE. A further power component LB3 is arranged on the second surface OF22 of the second region B12, which is also connected to the second busbar SS2 in a mechanically and electrically conductive manner, by means of a soldered joint which is not represented in the FIGURE.

With the circuit arrangement SA in service, the busbar SS1 conducts a current to the two power components LB2, LB3 which, in turn, is conducted away from the two power components LB2, LB3 by means of busbars which are not represented in the FIGURE. In this arrangement, the two power components LB2, LB3 are configured respectively as a power transistor and a power diode.

The circuit arrangement SA moreover may comprise an insulating layer IS, which covers the surfaces OF11, OF12, OF21, OF22 of the respective second regions B12, B22 of the two busbars SS1, SS2, surfaces O13, OF23 of the respective first regions B11, B21 of the two busbars SS1, SS2, which face away from the housing cover GD, the exposed surfaces of the power components LB1, LB2, LB3 which adjoin the cooling channel KK, and the surface OF of the housing cover GD, thereby electrically insulating the two busbars SS1, SS2, the three power components LB1, LB2, LB3 and the housing cover GD from the cooling channel KK. The insulating layer IS may comprise a thermoset plastic, and may have a film thickness of 50 to 150 micrometers.

During the operation of the circuit arrangement SA, waste heat is generated in the three power components LB1, LB2, LB3 as a result of power losses in the power components LB1, LB2, LB3. This waste heat is absorbed by the insulating layer IS and is discharged to the cooling agent flowing in the cooling channel KK. As a result of the short thermal conduction path between the power components LB1, LB2, LB3 and the cooling agent, waste heat can be evacuated efficiently.

In the interests of ease of handling during a subsequent installation phase on the housing cover GD, the two busbars SS1, SS2, can be mutually mechanically bonded, in a preliminary step, by means of a plastic carrier. To this end, the two busbars SS1, SS2, in those areas which are not designed for electrical connection with the power components LB1, LB2, LB3, or for mechanical attachment on the housing cover GD, are enclosed in a plastic mass which is formed by the curing of the plastic carrier, such that the two busbars SS1, SS2 are mutually mechanically bonded, and simultaneously are mutually electrically insulated.

Some embodiments may include additional busbars which are arranged to face each other and are mutually mechanically bonded by means of an insulating foil, which provides the mutual electrical insulation of the busbars. Between the power components LB1, LB2, LB3, further busbars may also be provided, for the mutual electrical connection of the power components LB1, LB2, LB3. Such busbars, together with the power components LB1, LB2, LB3 can then be fully immersed in the cooling channel KK, and surrounded by the cooling agent. In this arrangement, these busbars, in common with the respective second regions B12, B22 of the two above-mentioned busbars SS1, SS2, which project into the cooling channel KK, are enclosed in the insulating layer IS, and are thus electrically insulated from the cooling agent.

What is claimed is:

1. A circuit arrangement comprising:
   a carrier part including a circuit carrier;
   a power component connected mechanically and electrically to the carrier part;
   a cooling channel for conveying a cooling agent;
   a busbar connecting to a planar surface of the circuit carrier to conduct a current to the power component from the circuit carrier, the busbar having a region projecting away from the carrier part into the cooling channel; and
   an insulating layer encapsulating and fully sealing the busbar and the power component to the planar surface of the circuit carrier, electrically isolating the cooling agent in the cooling channel;
   wherein the power component is arranged on a first surface of the region and connected to the region in an electrically conductive and mechanical manner.

2. The circuit arrangement as claimed in claim 1, wherein the region projects away from the carrier part at an angle to the surface of the carrier part.

3. The circuit arrangement as claimed in claim 1, wherein the insulating layer is electrically insulating and thermally conductive.

4. The circuit arrangement as claimed in claim 1, wherein the insulating layer has a film thickness exceeding 50 micrometers.

5. The circuit arrangement as claimed in claim 1, wherein the insulating layer comprises a thermoset plastic, a thermoplastic, a cast plastic, or a lacquer.

6. The circuit arrangement as claimed in claim 1, wherein the region projects away from the carrier part at a perpendicular angle to the surface of the carrier part.

7. The circuit arrangement as claimed in claim 1, wherein the insulating layer has a film thickness exceeding 100 micrometers.

8. The circuit arrangement as claimed in claim 1, wherein the insulating layer has a film thickness up to 300 micrometers.

9. A current converter comprising:
   a carrier part including a circuit carrier;
   a power component connected mechanically and electrically to the carrier part;
   a cooling channel for conveying a cooling agent;
   a busbar conducting a current to the power component from the circuit carrier, the busbar having a region with a first surface and a second surface arranged opposite the first surface, the region projecting away from the carrier part into the cooling channel;
   the busbar secured to the carrier part by an electrically-insulating adhesive insulating foil; and
   an insulating layer encapsulating and fully sealing the busbar and the power component to the planar surface of the circuit carrier, electrically isolating the cooling agent in the cooling channel;
   wherein the power component is arranged on the first surface of the region and connected to the region in an electrically conductive and mechanical manner.

* * * * *